(12) United States Patent
Thummalapally et al.

(10) Patent No.: US 7,646,233 B2
(45) Date of Patent: Jan. 12, 2010

(54) LEVEL SHIFTING CIRCUIT HAVING JUNCTION FIELD EFFECT TRANSISTORS

(75) Inventors: Damodar R. Thummalapally, Milpitas, CA (US); Richard K. Chou, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 85 days.

(21) Appl. No.: 11/495,908

(22) Filed: Jul. 28, 2006

(65) Prior Publication Data

US 2007/0262806 A1  Nov. 15, 2007

Related U.S. Application Data

(60) Provisional application No. 60/799,787, filed on May 11, 2006.

(51) Int. Cl.
*H03K 3/01* (2006.01)
(52) U.S. Cl. .................. 327/536; 327/534; 327/333
(58) Field of Classification Search ................ 327/306, 327/307, 534–537, 333
See application file for complete search history.

(56) References Cited

U.S. PATENT DOCUMENTS

| | | | |
|---|---|---|---|
| 3,412,286 A | 11/1968 | Grebene | |
| 3,930,300 A | 1/1976 | Nicolay | |
| 3,936,929 A | 2/1976 | Bean et al. | |
| 3,943,551 A | 3/1976 | Skorup | |
| 3,951,702 A | 4/1976 | Kano et al. | |
| 3,955,182 A | 5/1976 | Bert | |
| 3,967,305 A | 6/1976 | Zuleeg | |
| 3,982,264 A | 9/1976 | Ishitani | |
| 4,036,672 A | 7/1977 | Kobayashi | |
| 4,038,563 A | 7/1977 | Zuleeg et al. | |
| 4,040,082 A | 8/1977 | Goser | |
| 4,062,036 A | 12/1977 | Yoshida | |

(Continued)

FOREIGN PATENT DOCUMENTS

EP  0193842  9/1986

(Continued)

OTHER PUBLICATIONS

U.S. Appl. No. 11/452,442, Kapoor, Ashok.

(Continued)

*Primary Examiner*—Dinh T. Le
(74) *Attorney, Agent, or Firm*—Haverstock & Owens, LLP (57) ABSTRACT

A level shifting circuit can include a first driver junction field effect transistor (JFET) having a source coupled to a reference supply node and a second driver JFET of a second conductivity type having a source coupled to a boosted supply node, and a first charge pump circuit. The first charge pump circuit can be coupled between the first driver control node and an input node coupled to receive an input signal, and can couple a first terminal of a first capacitor between a reference supply node and a power supply node in response to an input signal. The power supply node can be coupled to receive a power supply potential, the reference supply node can be coupled to receive a reference potential, and the boosted power supply node can be coupled to receive a boosted potential. The reference potential can be between the power supply potential and the boosted potential.

18 Claims, 5 Drawing Sheets

U.S. PATENT DOCUMENTS

| | | | |
|---|---|---|---|
| 4,064,525 A | 12/1977 | Kano et al. | |
| 4,126,900 A | 11/1978 | Koomen et al. | |
| 4,228,367 A | 10/1980 | Brown | |
| 4,333,224 A | 6/1982 | Buchanan | |
| 4,387,309 A | 6/1983 | Shacter | |
| 4,486,670 A | 12/1984 | Chan et al. | |
| 4,613,772 A | 9/1986 | Young | |
| 4,631,426 A | 12/1986 | Nelson et al. | |
| 4,638,344 A | 1/1987 | Cardwell, Jr. | |
| 4,663,543 A | 5/1987 | Sitch | |
| 4,667,312 A | 5/1987 | Doung et al. | |
| 4,698,653 A | 10/1987 | Cardwell, Jr. | |
| 4,703,199 A | 10/1987 | Ely | |
| 4,743,862 A | 5/1988 | Scheinberg | |
| 4,745,372 A | 5/1988 | Miwa | |
| 4,751,556 A | 6/1988 | Cogan et al. | |
| 4,763,028 A | 8/1988 | Henry | |
| 4,767,946 A | 8/1988 | Taylor | |
| 4,777,517 A | 10/1988 | Onodera et al. | |
| 4,853,561 A | 8/1989 | Gravrok | |
| 5,327,098 A | 7/1994 | Molina et al. | |
| 5,424,663 A | 6/1995 | Wong | |
| 5,428,232 A * | 6/1995 | Hika et al. | 257/256 |
| 5,618,688 A | 4/1997 | Reuss | |
| 5,773,891 A | 6/1998 | Delgado | |
| 5,808,501 A | 9/1998 | Ivanov | |
| 5,808,502 A * | 9/1998 | Hui et al. | 327/333 |
| 6,031,392 A | 2/2000 | Yee | |
| 6,072,354 A * | 6/2000 | Tachibana et al. | 327/390 |
| 6,307,223 B1 | 10/2001 | Yu | |
| 6,477,065 B2 * | 11/2002 | Parks | 363/21.06 |
| 2002/0197779 A1 | 12/2002 | Evans | |
| 2003/0107404 A1 | 6/2003 | Alvandpour et al. | |
| 2006/0220682 A1 | 10/2006 | Satou et al. | |

FOREIGN PATENT DOCUMENTS

| | | |
|---|---|---|
| EP | 0 276 670 A1 | 8/1988 |
| EP | 0 661 811 A2 | 7/1995 |
| EP | 0 661 811 A3 | 8/1996 |
| EP | 0 798 860 A2 | 10/1997 |
| EP | 0 798 860 A3 | 5/1999 |
| GB | 2208967 A | 4/1989 |
| JP | 60-258948 | 12/1985 |
| JP | 60258948 A | 12/1985 |
| JP | 9-246945 A | 9/1997 |

OTHER PUBLICATIONS

U.S. Appl. No. 60/799,787, Kapoor, Ashok.
U.S. Appl. No. 11/261,873, Kapoor, Ashok.
Hamadé, Adib R., "A JFET/Bipolar Eight-Channel Analog Multiplexer", *IEEE Journal of Solid-State Circuits*, Dec. 1975, pp. 399-406, vol. SC-10, No. 6.
Takagi et al., "Complementary JFET Negative-Resistance Devices", *IEEE Journal of Solid-State Circuits*, Dec. 1975, pp. 509-515, vol. SC-10, No. 6.
Lehovec, Kurt, "Analysis of GaAs FET's for Integrated Logic", *IEEE Transactions on Electron Devices*, Jun. 1980, pp. 1074-1091, vol. ED-27, No. 6.
Ozawa, Osuma, "Electrical Properties of a Triode-Like Silicon Vertical-Channel JFET", *IEEE Transactions on Electron Devices*, Nov. 1980, pp. 2115-2123, vol. ED-27, No. 11.
Nanver et al., "Design Considerations for Integrated High-Frequency p-Channel JFET's", *IEEE Transactions on Electron Devices*, Nov. 1988, pp. 1924-1934, vol. 35, No. 11.
Pelliconi et al., "Power Efficient Charge Pump in Deep Submicron Standard CMOS Technology", *27th European Solid-State Circuits Conference*, Sep. 2001.
PCT International Search Report and the Written Opinion of the International Search Authority for International Application PCT/US2007/074437, Feb. 2, 2008.
"Field-Effect Transistor Shifted Logic", *IBM Technical Disclosure Bulletin*, vol. 33, No. 3A, Aug. 1990.
Patent Abstracts of Japan, Abstract for Japanese Publication No. 09246945, Published Sep. 19, 1997.

* cited by examiner

LEVEL SHIFTING CIRCUIT HAVING JUNCTION FIELD EFFECT TRANSISTORS

This application claims the benefit of U.S. patent application Ser. No. 11/452,442 filed on Jun. 13, 2006, which claims the benefit of U.S. Provisional Patent Application Ser. No. 60/799,787 filed on May 11, 2006. The contents of both of these applications are incorporated by reference herein.

TECHNICAL FIELD

The present invention relates generally to level shifting circuits, and more particularly to level shifting circuits that include junction field effect transistors (JFETs).

BACKGROUND OF THE INVENTION

Level shifting circuits can translate an input signal that varies within one voltage range, to an output signal that varies within another, different voltage range. Typically, level shifting circuits can be utilized to translate between logic signals operating at different signal voltage levels (e.g., TTL to CMOS). Level shifting circuits for metal-oxide-semiconductor (MOS) type technologies, particularly CMOS type technology are well known.

In addition, "back biasing" MOS circuits are known that bias well or substrate regions of an integrated circuit to voltage levels less than ground. Such a back biasing of n-channel MOS transistors can reduce leakage in dynamic random access memory (DRAM) memory cell arrays, for example.

Co-pending U.S. patent application Ser. No. 11/452,442 filed on Jun. 13, 2006 and U.S. Provisional Patent Application Ser. No. 60/799,787 filed on May 11, 2006, both by Ashok K. Kapoor, show examples of novel circuits that include junction field effect transistors (JFETs) that operate at relatively low voltage levels (e.g., 0 to +0.5 volts). Such circuits can form integrated circuits that include few, or preferably no MOS type transistors. Accordingly, CMOS type level shifting circuits are of no benefit in shifting a low voltage internal signal (e.g., 0 to +0.5 volts) to some low output signal level (e.g., some negative voltage).

DETAILED DESCRIPTION OF THE EMBODIMENTS

Various embodiments of the present invention will now be described in detail with reference to a number of drawings. The embodiments show level shifting circuits and methods constructed with junction field effect transistors (JFETs), for example four terminal JFETs of complementary conductivity types (n-channel and p-channel types). Four terminal JFETs can include two control terminals on different sides of a channel region.

The disclosed embodiments are in contrast to conventional level shifting circuits formed from complementary metal-oxide-semiconductor (CMOS) type technologies, constructed with MOS type transistors that operate at supply voltage levels substantially greater than about +0.5 volts.

Figures 1, 2:
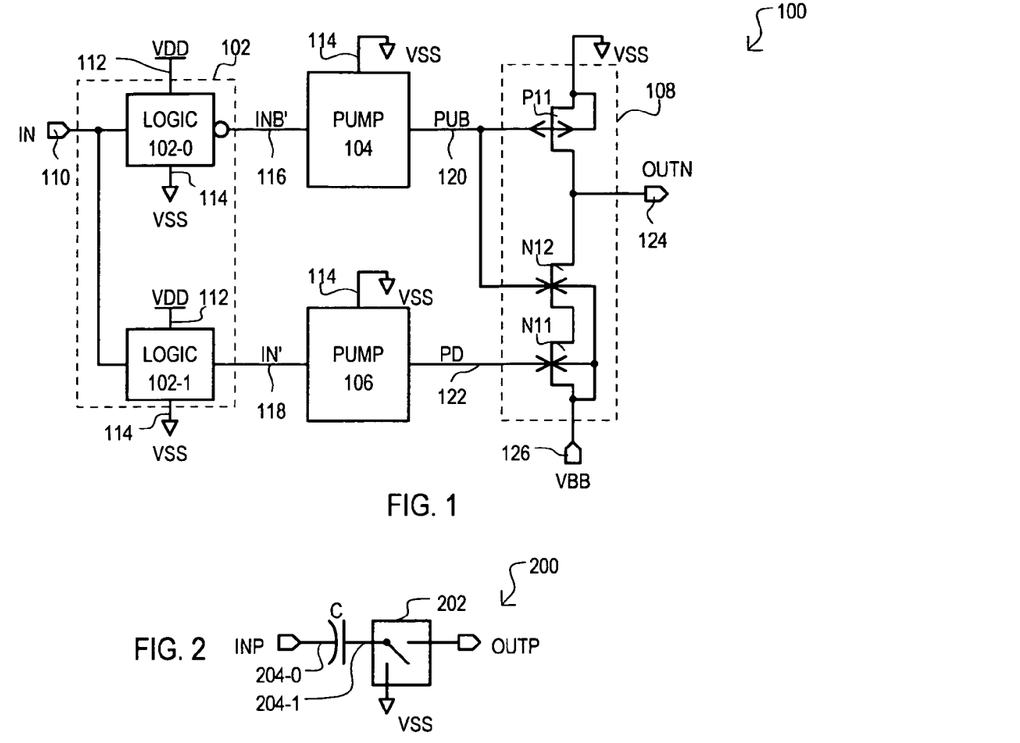
FIG. 1 is a block schematic diagram of a level shifting circuit according to a first embodiment.
FIG. 2 is a schematic diagram illustrating a charge pump circuit that can be included in the embodiments.

Referring now to FIG. 1, a level shifting circuit according to a first embodiment is shown in a block schematic diagram, and designated by the general reference character 100. A level shifting circuit 100 can receive an input signal IN having a first voltage swing, and generate an output signal OUTN having a second voltage swing, different from the first voltage swing.

In the particular example of FIG. 1, input signal IN and output signal OUTN can have an inverse relationship with one another. That is, when input signal IN transitions from high-to-low, output signal OUTN can transition from low-to-high, and vice versa. In addition, in the example shown, input signal IN can swing between a reference supply voltage VSS, and a high power supply voltage VDD. At the same time, output signal OUTN can swing between the reference supply voltage VSS and a boosted low supply voltage VBB that is less than reference supply voltage VSS. For example, power supply voltage VDD can be a positive voltage, reference voltage VSS can be zero volts, and boosted supply voltage VBB can be a negative voltage.

In the embodiment of FIG. 1, level shifting circuit 100 can include an input driver section 102, a first pump circuit 104, a second pump circuit 106, and an output driver section 108. An input driver section 102 can include a first logic section 102-0 and a second logic section 102-1. A first logic section 102-0 can be coupled between a first power supply node 112 and a reference supply node 114. In response to an input signal IN, first logic section 102-0 can drive a first pump input node 116 between a reference potential VSS and a power supply potential VDD. Similarly, in response to input signal IN, second logic section 102-1 can drive a second pump input node 118 between a reference potential VSS and a power supply potential VDD. In the particular example shown, first logic section 102-0 outputs a signal INB' that is the inverse of signal IN' output from second logic section 102-1.

A first pump section 104 can include a charge pump circuit that generates a voltage less than reference voltage VSS by a charge pump action. That is, a first pump section can generate a voltage less than VSS by utilizing a voltage VDD that is greater than VSS. In this way, a first pump section 104 can drive a first driver control node 120 below a reference potential VSS. In one particular example, a first pump section 104 can include a charge pump circuit that operates according to FIG. 2.

FIG. 2 is a schematic diagram showing a charge pump circuit 200. A charge pump circuit 200 can include a capacitor C, and a switch 202. In a first pump action, a first capacitor node 204-0 can receive a pump input signal INP at a high supply voltage VDD, while a second capacitor node 204-1 can be connected to a reference voltage VSS by switch 202. In a second pump action, a first capacitor node 204-0 can be connected to reference supply voltage VSS, while a second capacitor node 204-1 is allowed to float, at least temporarily. Such an action can drive a pump output signal OUTP below a reference voltage VSS.

A second pump section 106 can also include a charge pump circuit that generates a voltage less than reference voltage VSS. Such a voltage can be used to drive a second driver control signal PD to a reference potential VSS. More particularly, second pump 106 can generate a voltage below VSS in order to enable a signal path between reference voltage VSS and second driver control node 122. In one particular example, a second pump section 106 can include a charge pump circuit like that of FIG. 2.

Referring still to FIG. 1, a driver section 108 can include a first driver JFET P11, a second driver JFET N11 and a third driver JFET N12. A first driver JFET P11 can provide a controllable impedance path between a reference supply node 114 and an output node 124. In the particular example of FIG. 1, JFET P11 can have a source-drain path connected between reference supply node 114 and output node 124, and a gate connected to a first driver control node 120. A third driver JFET N12 can provide a controllable impedance path between output node 124 and second driver JFET N11. In the particular example of FIG. 1, JFET N12 can have a source-drain path connected to output node 124 and a gate connected to a first driver control node 120. A second driver JFET N11 can provide a controllable impedance path between a source of JFET N12 and a boosted supply node 126, which can receive a negative boosted voltage VBB. In the particular example of FIG. 1, JFET N11 can have a source-drain path connected between a source of JFET N12 and boosted supply node 126 and a gate connected to a second driver control node 122.

In the example of FIG. 1, JFETs P11, N11 and N12 can be four terminal JFETs, having a first control gate and second control gate separated from one another by a channel region. First gate connections for such transistors have been described above. In addition, JFET P11 can have a second gate connected to a reference power supply node 114, JFETs N11 and N12 can have second gates connected to a boosted supply node 126.

In such a configuration, when an input signal IN transitions to a low level (e.g., VSS) from a high level (e.g., VDD), a first driver control signal PUB at first driver control node 120 can be driven below reference voltage VSS by more than a threshold voltage of JFET P11. In addition, a second driver control signal PD can also be driven to below reference voltage VSS. As a result, JFETs N11 and N12 can be turned off and JFET P11 can be turned on, connecting output node 124 to reference voltage VSS.

When an input signal IN transitions to a high level (e.g., VDD) from a low level (e.g., VSS), a first driver control signal PUB and second driver control signal PD can be driven to voltage VSS. As a result, JFET P11 can be turned off, and transistors N11 and N12 can be turned on, connecting output node 124 to a boosted voltage VBB.

In this way, a level shifting circuit can shift a first voltage, varying between VDD and VSS to a second voltage varying between VSS and VBB, where voltage VSS can be between voltages VDD and VBB.

Figure 3:
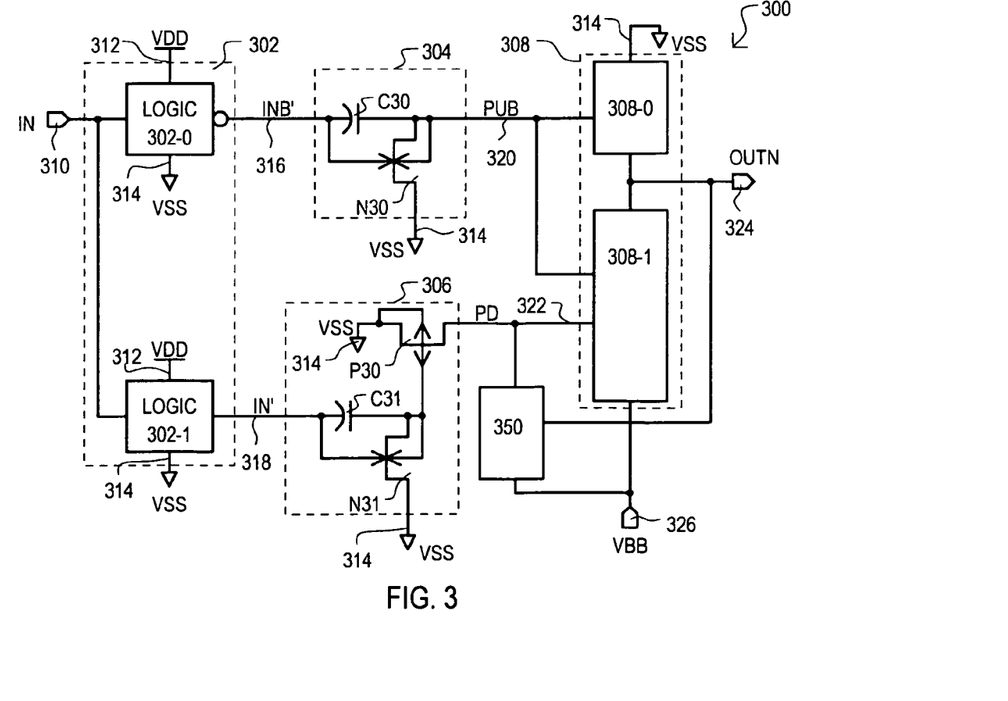
FIG. 3 is a block schematic diagram of a level shifting circuit according to a second embodiment.

Referring now to FIG. 3, a level shifting circuit according to a second embodiment is shown in a block schematic diagram, and designated by the general reference character 300. The embodiment of FIG. 3 can provide the same level shifting operation as that of FIG. 1, shifting an input signal IN that varies between a reference voltage VSS and a high supply voltage VDD to an output signal OUTN that varies between reference voltage VSS and a boosted voltage VBB. Reference voltage VSS can be a potential between VDD and VBB.

A level shifting circuit 300 can include an input driver section 302, a first pump circuit 304, a second pump circuit 306, an output driver section 308, and a feedback section 350. An input driver section 302 can have the same general construction as input driver section 102 of FIG. 1.

A first pump circuit 304 can include a capacitor C30 and a JFET N30. A capacitor C30 can have one terminal connected to a first pump input node 316 and a second terminal connected to a first driver control node 320. JFET N30 can be an n-channel JFET with a source connected to a reference power supply node 314, a gate connected to first pump input node 316, and a drain connected first driver control node 320. In such an arrangement, when an input signal INB' is high (e.g., at VDD), JFET N30 can turn on, connecting node 320 to a reference voltage VSS, and capacitor C30 can be charged by a VDD potential at node 316, with respect to reference voltage VSS. When input signal INB' transitions low (e.g., to VSS), JFET N30 can be turned off, and the VSS potential at node 316 can force node 320 to a potential that is negative with respect to VSS.

In this way, first charge pump circuit 304 can drive first driver control signal PUB between a reference potential VSS, and a potential that is negative with respect to VSS.

A second charge pump circuit 306 can include a capacitor C31, a JFET N31, and a JFET P30. A capacitor C31 can have one terminal connected to a second pump input node 318. JFET N31 can be an n-channel JFET with a source connected to a reference power supply node 314, a gate connected to second pump input node 318, and a drain connected a gate of JFET P30. JFET P30 can be a p-channel JFET having a source-drain path connected between a reference supply node 314 and a second driver control node 322. In such an arrangement, when an input signal IN' is high (e.g., at VDD), JFET N31 can turn on, connecting a gate of JFET P30 to a reference voltage VSS, and capacitor C31 can be charged by a VDD potential at node 318. JFET P30 can be turned off, as both its gate and source can be at the reference voltage VSS. When input signal IN' transitions low (e.g., to VSS), JFET N31 can be turned off, and the potential at the gate of JFET P30 can be forced to a potential that is negative with respect to VSS, by more than a threshold voltage of JFET P30. JFET P30 can thus be turned on, connecting second driver control node 322 to a reference voltage VSS.

In this way, first charge pump circuit 304 can drive first driver control signal PUB to a reference potential VSS.

In the example of FIG. 3, JFETs N30, N31 and P30 can be four terminal JFETs, having a first control gate and second control gate separated from one another by a channel region. First gate connections for such transistors have been described above. In addition, JFET N30 can have a second gate connected to first driver control node 320, JFET N31 can have a second gate connected to a gate of JFET P30, and JFET P30 can have a second gate connected to a reference supply node 314.

An output driver section 308 can include a pull-up section 308-0 and a pull-down section 308-1. A pull-up section 308-0 can connect or disconnect an output node 324 to a reference supply node 314. In particular, when first driver control node PUB is driven to a predetermined amount below VSS, pull-up section 308-0 can provide a low impedance. When first driver control node PUB is at a reference voltage VSS, pull-up section 308-0 can provide a high impedance. In a similar fashion, a pull-down section 308-1 can connect or disconnect an output node 324 to a boosted supply node 326. In particular, when a first driver control signal PUB and second driver control signal PD are driven a predetermined amount below VSS, a pull-down section 308-1 can provide a high impedance. However, when a first driver control signal PUB and second driver control signal PD are driven to a reference voltage VSS, pull-down section 308-1 can provide a low impedance path.

A feedback section 350 can be formed between a second driver control node 322 and boosted supply node 326. A feedback section 350 help ensure that a second driver control signal PD remains sufficiently low to maintain pull-down section 308-1 in a high impedance state, when pull-up section 308-0 is providing a low impedance. In particular, when an output node 324 is at a reference voltage VSS, feedback section 350 can provide a low impedance, and when an output node 324 is at a boosted voltage VBB, feedback section 350 can provide a high impedance.

In this way, a level shifting circuit can utilize JFET devices, preferably four terminal JFET devices in charge pump circuits to produce voltage levels below a reference voltage VSS.

Figure 4:
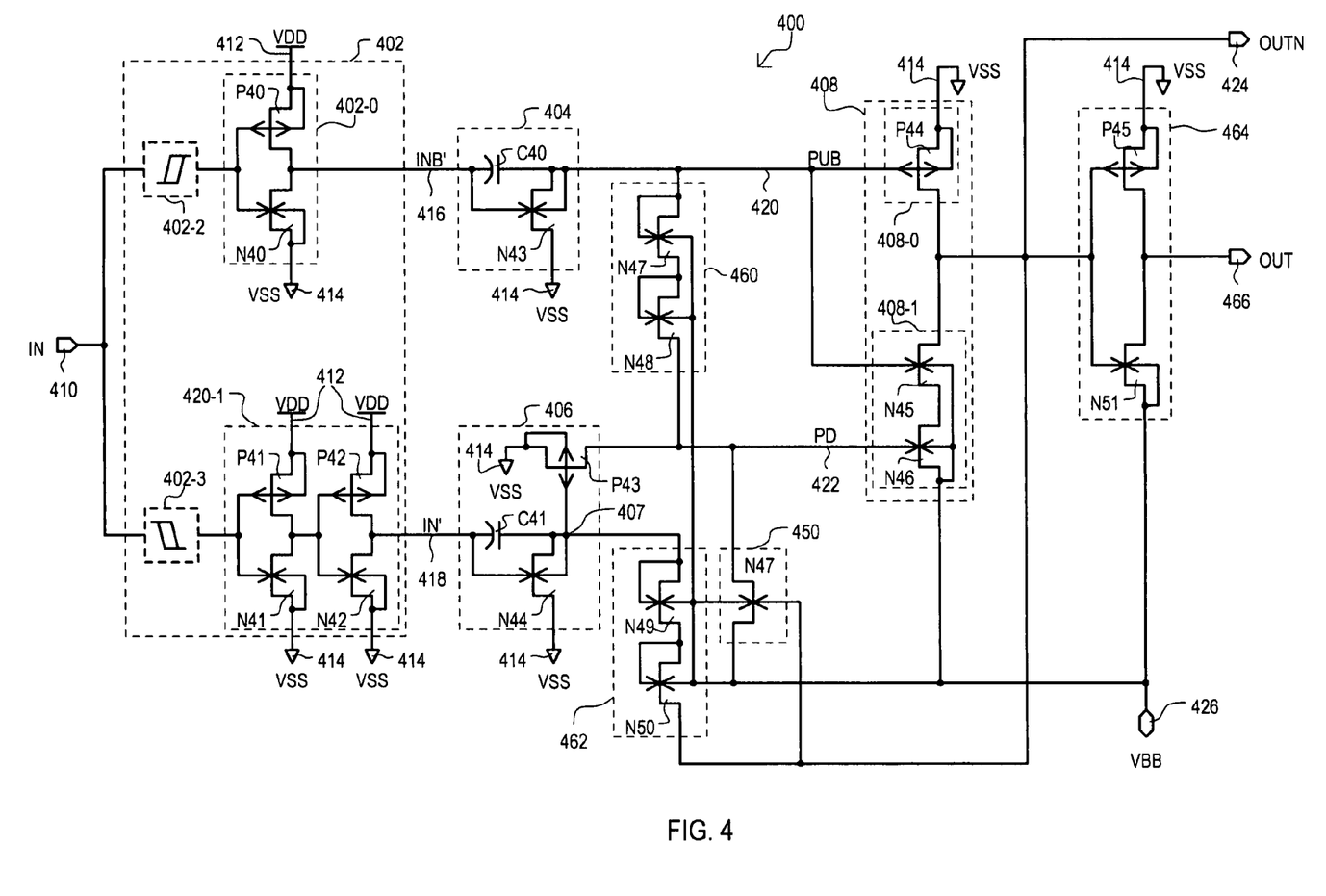
FIG. 4 is a schematic diagram of a level shifting circuit according to a third embodiment.

Referring now to FIG. 4, a level shifting circuit according to a third embodiment is shown in a detailed schematic diagram, and designated by the general reference character 400. In the particular example of FIG. 4, an input signal IN that varies between a high supply voltage VDD and a reference voltage VSS, can be shifted to generate first and second output signals OUTN and OUT that vary between reference voltage VSS and a boosted voltage VBB. Output signal OUTN can vary in an inverse fashion to input signal IN, and output signal OUT can follow signal IN at the shifted voltage level. In one particular embodiment, a high supply voltage VDD can be about +0.5 volts, which is substantially smaller than conventional CMOS voltage levels, reference voltage VSS can be zero volts, or ground, and a boosted voltage VBB can be about −0.5 volts.

Referring to FIG. 4, a level shifting circuit 400 can include an input driver section 402, a first pump circuit 404, a second pump circuit 406, a first output driver section 408, a feedback section 450, a first clamping section 460, a second clamping section 462, and a second output driver section 464. An input driver section 402 can include a first logic section 402-0 and a second input logic section 402-1. A first logic section 402-0 can be an inverter circuit formed by complementary conductivity JFETs P40 and N40. In particular, JFET P40 can be a p-channel JFET having a source connected to a high power supply node 412, a drain connected to a first pump input node 416, and a gate connected to an input node 410. JFET N40 can be an n-channel JFET having a source connected to a reference supply node 414, a drain connected to a first pump input node 416, and a gate connected to input node 410.

A second input logic section 402-1 can include two inverters, like that of the first logic section 402-1, arranged in series with one another between input node 410 and a second pump input node 418. A first of these inverters can be formed by JFETs P41/N41, and a second of these inverters can be formed by JFETs P42/N42.

Optionally, an input driver section 402 can include a first delay circuit 402-2 and/or a second delay circuit 402-3. Such delay circuits (402-2 and/or 402-3) can help ensure that within first output driver section 408, a pull-up path 408-0 is disabled before a pull-down path 408-1 is enabled, and vice versa. In the particular example shown, a first delay circuit 402-2 can be an edge delay circuit that introduces a greater delay into a low-to-high transition than a high-to-low transition. A second delay circuit 402-3 can be an edge delay circuit that introduces a greater delay into a high-to-low transition than a low-to-high transition.

A first pump circuit 404 can include a first capacitor C40 and an n-channel JFET N43, and can have the same general construction and operation as first pump circuit 304 of FIG. 3. Similarly, second pump circuit 406 can include a second capacitor C41, an n-channel JFET N44, and a p-channel JFET P43, and have the same general construction and operation as second pump circuit 306 of FIG. 3. The node connecting a gate of JFET P43, a second terminal of capacitor C41, and a gate/drain of JFET N44 will be referred to herein as a control node 407.

A first output driver section 408 can include a p-channel JFET P44 and n-channel JFETs N45 and N46, and can have the same general construction and operation as output driver section 108 of FIG. 1.

A feedback section 450 can include an n-channel JFET N47 having a source-drain path connected between a second driver control node 422 and a boosted voltage supply node 426, and a gate connected to a first output node 424. In such an arrangement, when a first output signal OUTN is driven to a reference voltage VSS, JFET N47 can be turned on, thus connecting second driver control node 422 to a boosted supply voltage VBB. This can turn off transistor N46 within first output driver section 408.

While first and second charge pump circuits (404 and 406) can drive first and second driver control nodes (420 and 422) with a charge pumping action, it may be desirable to clamp such nodes at particular potentials less than VSS after such an initial charge pump action. To accomplish such an operation, a level shifting circuit 400 can include a first clamping section 460 and a second clamping section 462.

A first clamping section 460 can help maintain a first driver control node 420 at a low potential with respect to reference voltage VSS. First clamping section 460 can include n-channel JFETs N47 and N48. JFET N47 can have a gate and drain connected to a first driver control node 420 and JFET N48 can have a gate and drain connected to a source of NFET N47, and a source connected to second driver control node 422. In such an arrangement, first driver control node 420 can be clamped at a potential of about VBB−2*Vthn, where Vthn is a threshold voltage of JFETs N47 and N48.

A second clamping section 462 can help maintain control node 407 at a predetermined low potential (with respect to reference voltage VSS). Second clamping section 460 can include n-channel JFETs N49 and N50. JFET N49 can have a gate and drain connected to a control node 407 and JFET N50 can have a gate and drain connected to a source of NFET N49, and a source connected to first output node 424. In such an arrangement, control node 407 can be clamped at a potential of about −VBB−2*Vthn, where Vthn is a threshold voltage of JFETs N49 and N50.

A second output driver section 464 can include a p-channel JFET P45 and n-channel JFET N51. JFET P45 can have a source connected to a reference supply node 414, a gate connected to first output node 424, and a drain connected to second output node 466. JFET N51 can have a source connected to a boosted supply node 426, a gate connected to first output node 424, and a drain connected to second output node 466. In such an arrangement, second output driver section 464 can operate as an inverter with respect to signal OUTN, to generate second output signal OUT that swings between the reference voltage VSS and boosted voltage VBB levels.

Referring still to FIG. 4, it is noted that preferably, JFET P43 is sized to be larger than JFET N47. This can enable JFET P43 to rapidly pull-up second driver control node 422 when enabled. Similarly, transistor P44 can be sized larger than JFETs N45 and N46, to enable first output node 424 to be pulled rapidly to a reference voltage VSS when enabled. Still further, JFETs P45 and N51 can be larger sized JFETs with respect to all other JFETs shown in FIG. 4, to provide greater charging and discharging capabilities at second output node 466.

Figure 5:
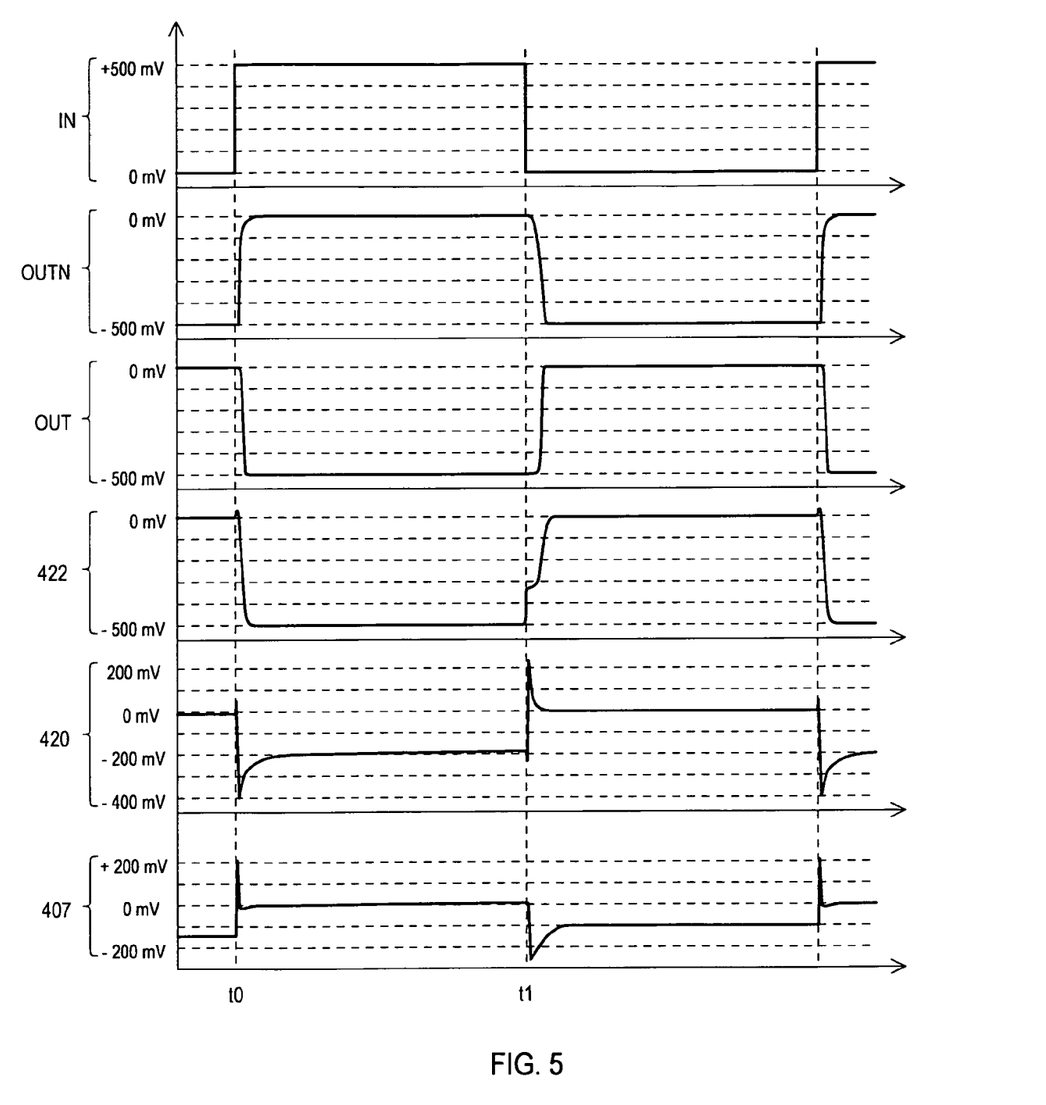
FIG. 5 is a timing diagram showing the operation of the level shifting circuit of FIG. 4.

Having described the general construction of the embodiment shown in FIG. 4, the operation of the level shifting circuit 400 will now be described with reference to FIG. 5. FIG. 5 is a timing diagram showing the response of an input signal IN received at input node 410, a first output signal OUTN generated at first output node 424, a second output signal OUT generated at second output node 466, a potential at second driver control node 422, first driver control node 420, and a control node 407 within second charge pump circuit 406. In the particular example shown by FIG. 5, a power supply voltage VDD can be about +0.5 volts, a reference voltage VSS can be about 0 volts, and a boosted voltage can be about −0.5 volts.

Referring now to FIG. 4 in conjunction with FIG. 5, at about time t0, input signal IN can transition from a low level (e.g., VSS) to a high level (e.g. VDD). Along a "pull-up" path, signal IN can be inverted by first logic section 402-0 to drive first charge pump input node 416 from a high level (e.g., VDD) to a low level (e.g., VSS). As a result, a potential at first driver control node 420 can be driven to a negative potential, with respect to VSS. JFET P44 within first output driver section 408 can be turned on and JFET N45 can be turned off, driving first output signal OUTN from a VBB level to a VSS level. With first output signal OUTN at a VSS level, feedback section 450 can provide a low impedance, driving second driver control node 422 to a boosted potential VBB. Signal OUTN can be inverted by second output driver section 464 to drive second output signal OUT from a VSS level to a VBB level.

Along a "pull-down" path, signal IN can be buffered by a second logic section 402-1 to drive second charge pump input node 418 from a low level (e.g., VSS) to a high level (e.g., VDD). As a result, second capacitor C41 can be charged, and a second control node 407 can be driven to a reference potential VSS. This can turn off JFET P43, isolating second driver control node 422 from a reference potential VSS. This can enable JFET N47, turned on by first output signal OUTN, to pull second driver control node to the boosted voltage VBB, and turn off JFET N46 within first output section 408.

In this way, in response to an input signal IN switching from VSS to VDD, first output signal OUTN can transition from VBB to VSS, and second output signal OUT can transition from VSS to VBB.

Referring still to FIG. 4 in conjunction with FIG. 5, at about time t1, input signal IN can transition from a high level (e.g., VDD) to a low level (e.g. VSS). Along a "pull-up" path, signal IN can be inverted by first logic section 402-0 to drive first charge pump input node 416 from a low level (e.g., VSS) to a high level (e.g., VDD). As a result, a potential at first driver control node 420 can be driven to reference voltage VSS. JFET P44 within first output driver section 408 can be turned off and JFET N45 can be turned on. Capacitor C40 can be charged to a VDD level with respect to a VSS level.

Along a "pull-down" path, signal IN can be buffered by a second logic section 402-1 to drive second charge pump input node 418 from a high level (e.g., VDD) to a low level (e.g., VSS). As a result, control node 407 can be driven to a negative potential, with respect to VSS. JFET P43 within second charge pump circuit 406 can be turned on and thus over power JFET N47, and second driver node 422 can be driven to reference potential VSS.

Within first output driver circuit 408, JFET N46 can be turned on and thus drive output signal OUTN from a VSS level to a VBB level. With first output signal OUTN at a VBB level, feedback section 450 can be switched to a high impedance state. In response to the transition in first output signal OUTN, second driver output section 464 can drive second output signal OUT from VBB level to a VSS level.

In the example of FIG. 4, all JFETs can be four terminal JFETs, having a first control gate and second control gate separated from one another by a channel region. First gate connections for such transistors have been described above. In addition, JFETs P40, N40, P41, N41, P42, N42, N43, N44, P44, N46, P45 and N51 can have their second gates connected to their respective sources. JFETs N47, N48, N49, N50, and N45 can have their second gates connected to boosted supply node 426. Thus, in the particular embodiment of FIG. 4, a level shifting circuit can be composed of active devices, all of which are four terminal JFETs.

In this way, in response to an input signal IN switching from VDD to VSS, first output signal OUTN can transition from VSS to VBB, and second output signal OUT can transition from VBB to VSS.

Figures 6A, 6B, 7:
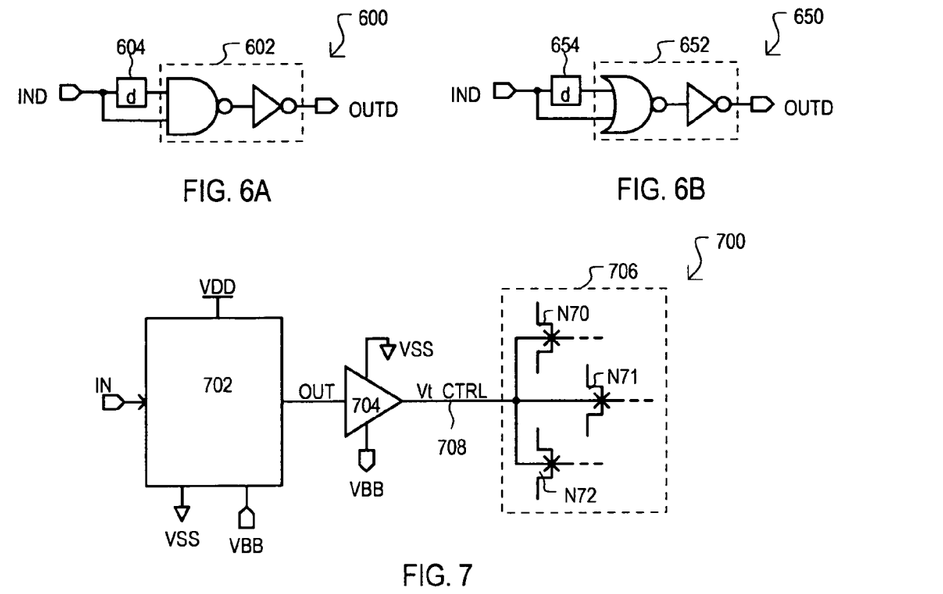
FIGS. 6A and 6B are schematic diagrams of delay circuits that can be included in the embodiments.
FIG. 7 is a block schematic diagram of a level shifting circuit according to a fourth embodiment.

Referring now to FIG. 6A, one example of a delay circuit that can be included in the embodiments is shown in a schematic diagram and designated by the general reference character 600. Delay circuit 600 can include an AND gate 602 having a delay element 604 connected to one input. Such a configuration can introduce a delay into a low-to-high transition of an input signal. Thus, delay circuit 600 could be one example of a circuit used like that shown as 402-2 in FIG. 4.

Referring now to FIG. 6B, an example of another delay circuit is shown and designated by the general reference character 650. Delay circuit 650 can include an OR gate 652 having a delay element 654 connected to one input. Such a configuration can introduce a delay into a high-to-low transition of an input signal. Thus, delay circuit 650 could be one example of a circuit used like that shown as 402-3 in FIG. 4.

Of course, FIGS. 6A and 6B are but two of the many possible delay circuits than could be used to delay one particular type of signal transition.

Further, delay circuits like those of FIGS. 6A and 6B can be included in the embodiments of FIG. 1 and/or 2 in order ensure pull-up paths are disabled prior to pull-down paths being enabled, and vice versa.

Referring now to FIG. 7, a level shifting circuit according to a fourth embodiment is shown in a block schematic diagram and designated by the general reference character 700. A level shifting circuit 700 can include a level shifting section 702, one or more buffer circuits 704, and a variable threshold section 706. A level shifting section 702 can include a level shifting circuit like any of those described above, and can shift an input signal IN varying between levels VDD and VSS, to an output signal OUT that can vary between VSS and VBB, where VSS is between VDD and VBB. Preferably, VDD is positive with respect to VSS and VBB is negative with respect to VSS.

A buffer circuit 704 can buffer a signal OUT to provide more current drive capability, if necessary, to achieve a desired response. Buffer circuit 704 can drive a threshold control signal Vt_CTRL between levels VSS and VBB at a gate drive node 708.

A variable threshold section 706 can include a number of JFET devices, represented by JFETs N70, N71 and N72, each having one gate connected to gate drive node 708. The other gate of such devices can receive logic signals for executing a particular function. In one particular example, variable threshold section 706 can be a logic circuit operating between a power supply voltage VDD and a reference voltage VSS. Even more particularly, JFETs N70, N71 and N72 can be n-channel JFETs having two modes of operation. In a first mode, gate drive node 708 can be driven to a boosted voltage VBB, and JFETs N70, N71 and N72 can operate at a certain speed and with a certain current consumption. In a second mode, gate drive node 708 can be driven to a reference voltage VSS, and JFETs N70, N71 and N72 can operate at a faster speed than the first mode, but with greater current consumption than the first mode.

In this way, a level shifting circuit can be used to drive one gate of one or more four terminal JFETs, and thus provide two modes of operation for such JFETs.

Figure 8:
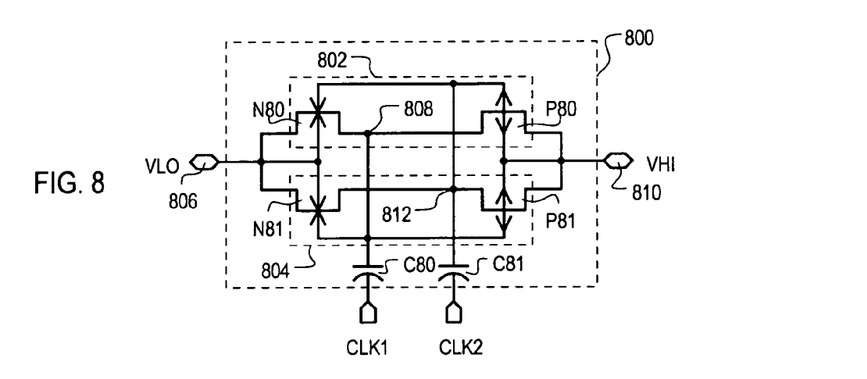
FIG. 8 is a boosted voltage generator stage according to an embodiment.

Referring now to FIG. 8, an example of a boosted voltage generator stage according to an embodiment is shown in a schematic diagram and designated by the general reference character 800. A boosted generator stage 800 can be used to generate a boosted voltage, like VBB shown in the above embodiments. The particular boosted voltage stage 800 can include a first stage 802, a second stage 804, and capacitors C80 and C81. First stage 802 can include an n-channel JFET N80 having a source-drain path connected between a low boost node 806 and a first charge node 808, and a p-channel JFET P80 having a source-drain path connected between first charge node 808 and a high reference node 810. Gates of JFETs P80 and N80 can be connected to second charge node 812.

A second stage 804 can include an n-channel JFET N81 having a source-drain path connected between low boost node 806 and a second charge node 812, and a p-channel JFET P81 having a source-drain path connected between second charge node 812 and a high reference node 810. Gates of JFETs P81 and N81 can be connected to first charge node 808.

Capacitor C80 can have one terminal connected to first charge node 808 and another terminal that receives a periodic clock signal CLK1. Capacitor C81 can have one terminal connected to second charge node 812 and another terminal that receives a periodic clock signal CLK2, which can be essentially the inverse of clock signal CLK1.

In operation, when signal CLK1 is low and signal CLK2 is high, previously charged capacitor C80 can drive first charge node 808 below the potential at high reference node 810. JFET P80 can be turned off, and JFET N80 can be turned on, thus driving low boost node 806 to a lower potential than high reference node 810. At the same time, JFET P81 can be turned on, connecting second charge node 812 to high reference node 810. Signal CLK2 can charge capacitor C81 to a potential higher than high reference node 810.

When signal CLK1 is high and signal CLK2 is low, previously charged capacitor C81 can drive second charge node 812 below the potential at high reference node 810. JFET P81 can be turned off, and JFET N81 can be turned on, thus driving low boost node 806 to a lower potential than high reference node 810. At the same time, JFET P80 can be turned on, connecting first charge node 808 to high reference node 810. Signal CLK1 can charge capacitor C80 to a potential higher than high reference node 810.

In the example of FIG. 8, all JFETs can be four terminal JFETs, having a first control gate and second control gate separated from one another by a channel region. First gate connections for such transistors have been described above. In addition, second gates of JFETs N80 and N81 can be commonly connected to low boost node 806, while second gates of JFETs P80 and P81 can be commonly connected to a high reference node 810.

In this way, a boosted voltage generator stage can generate a boost voltage utilizing JFETs, preferably complementary four terminal JFETs.

While a single boosted voltage generator stage, like that of FIG. 8, can provide a given boosted voltage. It may be desirable to provide boosted voltages of even greater magnitude. In such a case, several generator stages like that of FIG. 8 can be connected in series to form a voltage generator circuit. One example of such an arrangement is shown in FIG. 9.

Figure 9:
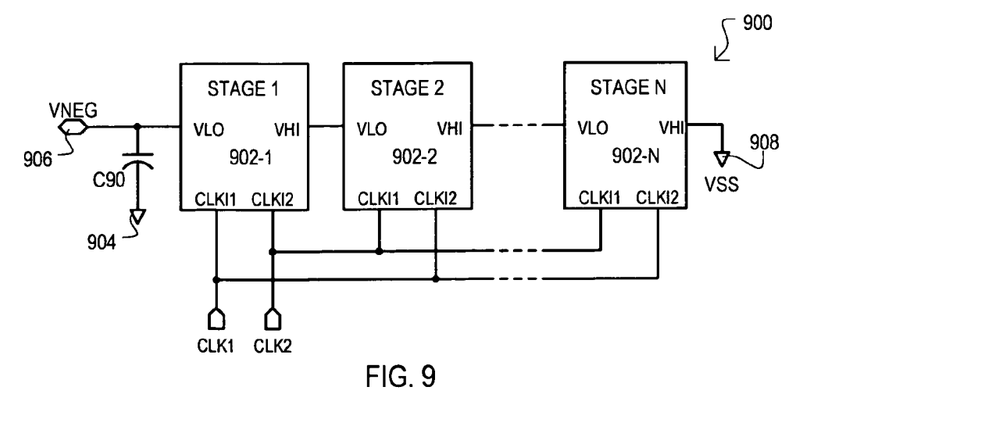
FIG. 9 is a block schematic diagram of a negative voltage generator according to an embodiment.

FIG. 9 shows a voltage generator 900 that can include a number of generator stages 902-1 to 902-N, each of which can take the form of generator stage 800 shown in FIG. 8. A first generator stage 902-1 can have a low boost node connected to a boosted supply node 906. A capacitor C90 can be connected between boosted supply node 906 and a reference supply node 904. A next generator stage 902-2 can have a low boost node (VLO) connected to a high reference node (VHI) of a previous stage. Each generator stage can be connected to the next stage in this fashion, ending with a last generator stage 902-N, which can have a high reference node VHI connected to a reference supply node 908. Clock signals CLK1 and CLK2 can be connected to to generator stages (902-1 to 902-N) in an alternating fashion with respect to a first clock inputs CLKI1 and a second clock inputs CLKI2.

In this way, a series of generator stages can be connected together to generate boosted voltage levels of greater magnitude.

Figure 10:
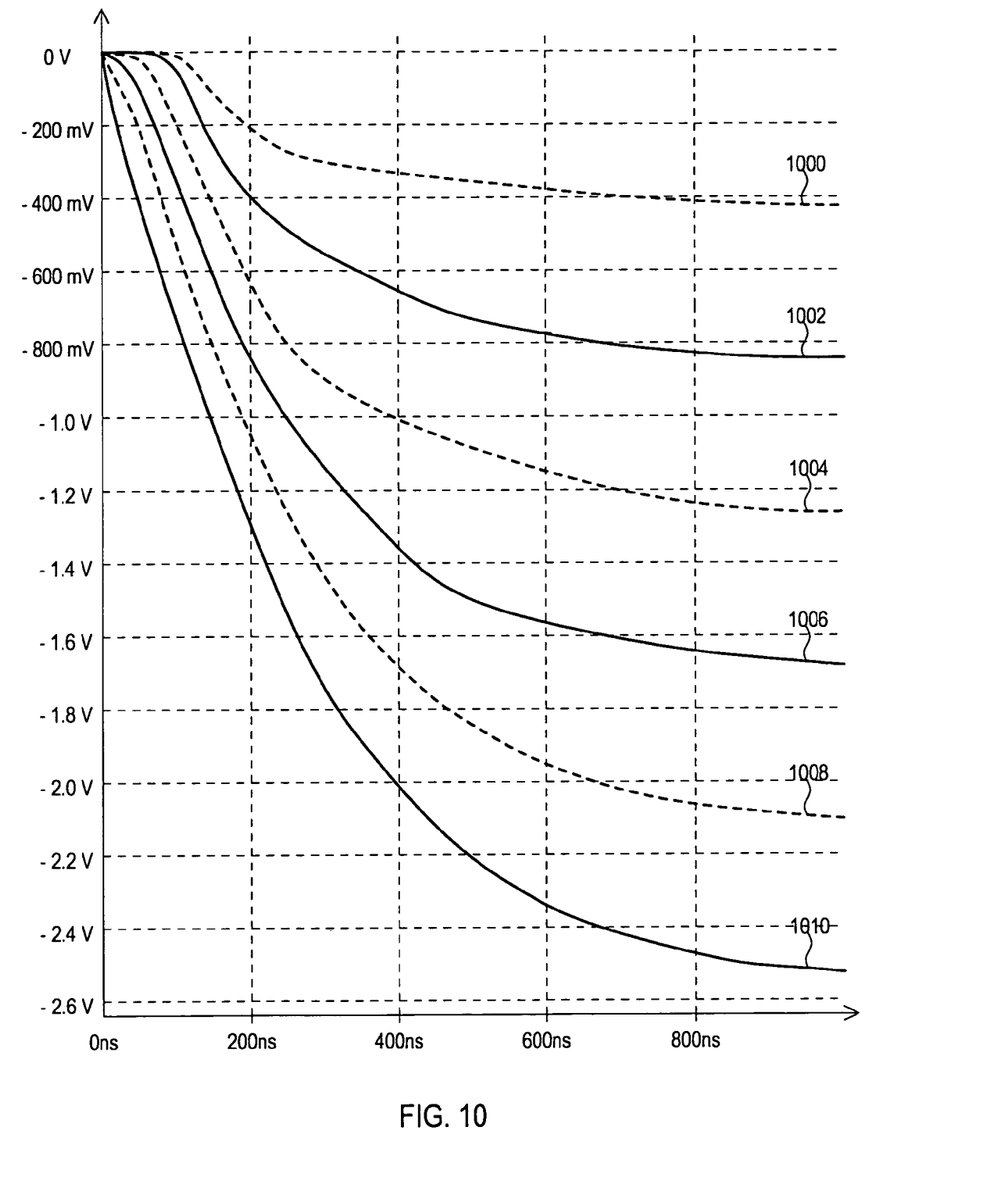
FIG. 10 is a diagram showing the operation of the circuit of FIG. 9 and variations thereof.

Referring now to FIG. 10, a timing diagram shows the response of a voltage generator, like that shown in FIG. 9, having six stages (e.g., N=6). FIG. 10 includes six waveforms, each of which shows a potential at a low boost node (VLO) of each stage over time. Waveforms 1000, 1002, 1004, 1006, 1008 and 1010 show the responses of generator stages 902-6 to 902-1, respectively.

It is understood that reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A level shifting circuit, comprising:
a first driver p-type junction field effect transistor (JFET) of a having a source coupled to a reference supply node, a drain coupled to an output node, and a gate coupled to a first driver control node;
a second driver n-type JFET having a source coupled to a boosted supply node and a drain coupled to the output node; and
a first charge pump circuit coupled between the first driver control node and an input node coupled to receive an input signal, the first charge pump circuit coupling a first terminal of a first capacitor between the reference supply node and a power supply node in response to the input signal; wherein the power supply node is coupled to receive a power supply potential, the reference supply node is coupled to receive a reference potential, the boosted power supply node is coupled to receive a boosted potential, the power supply potential is positive with respect to the reference potential, and the boosted potential is negative with respect to the reference potential.

2. The level shifting circuit of claim 1, wherein:
the first driver p-type JFET and second driver n-type JFET are both four terminal JFETs having a first control gate separated from a second control gate by a channel region.

3. The level shifting circuit of claim 1, further including:
the second driver n-type JFET includes a gate coupled to a second driver control node; and
a second charge pump circuit coupled to the input node that couples a first terminal of a second capacitor between the reference supply node and the power supply node in response to the input signal.

4. The level shifting circuit of claim 3, wherein:
the second charge pump circuit includes
a pump JFET having a gate coupled to the first terminal of the second capacitor, a drain coupled to a second terminal of the second capacitor, and a source coupled to the reference supply node, and
a control JFET having a source coupled to the reference supply node, a drain coupled to the second driver control node, and a gate coupled to the second terminal of the second capacitor.

5. The level shifting circuit of claim 3, further including:
a logic circuit coupled between the input node and the second charge pump circuit that inverts the input signal with respect to the input signal received by the first charge pump circuit.

6. The level shifting circuit of claim 3, further including:
a second driver clamp circuit coupled between the output node and the second charge pump circuit that clamps a second terminal of the second capacitor to a predetermined level below the reference potential when the second driver n-type JFET provides a low impedance path between the boosted power supply node and the output node.

7. The level shifting circuit of claim 1, wherein:
the first charge pump circuit further includes a pump JFET having a gate coupled to the first terminal of the first capacitor, a drain coupled to a second terminal of the first capacitor and to the first driver control node, and a source coupled to the reference supply node.

8. The level shifting circuit of claim 1, further including:
an enable n-type JFET having a source coupled to the drain of the second driver n-type JFET, a gate coupled to the first driver control node, and a drain coupled to the output node.

9. The level shifting circuit of claim 1, further including:
a first driver clamp circuit coupled between the boosted power supply node and the first charge pump circuit that clamps a second terminal of the first capacitor to a predetermined level below the boosted potential when first driver p-type JFET provides a low impedance path between the reference power supply node and the output node.

10. A level shifting circuit, comprising:
a first charge pump circuit comprising at least a first pump junction field effect transistor (JFET) having a source-drain path coupled between a reference supply node and a first driver control node and a first capacitor coupled to the first driver control node;

a second charge pump circuit comprising at least a second pump JFET having a source-drain path coupled between the reference supply node and a second driver control node, and a second capacitor coupled to the gate of the second pump JFET; and
a driver section that selectively couples an output node between the reference supply node and a boosted supply node in response to a first driver control node potential and a second driver control node potential.

11. The level shifting circuit of claim 10, wherein:
the first pump JFET comprises an n-channel JFET; and
the second pump JFET comprises a p-channel JFET.

12. The level shifting circuit of claim 10, wherein:
the second charge pump circuit further includes a third pump JFET having a source-drain path coupled between the gate of the second pump JFET and the reference supply node.

13. The level shifting circuit of claim 10, further including:
a feedback path coupled between the second driver control node and the boosted supply node that provides a low or high impedance path according to the potential at the output node.

14. The level shifting circuit of claim 10, further including:
the first capacitor has a first terminal coupled to a first charge pump input node and a second terminal coupled to the first driver control node;
the second capacitor has a first terminal coupled to a second charge pump input node and a second terminal coupled to the second driver control node; and
an input driver circuit that selectively couples the first charge pump input node and second charge pump input nodes between the reference supply node and a power supply node; wherein
the power supply node is coupled to receive a power supply voltage having a first polarity with respect to the reference supply node, and the boosted supply node is coupled to receive a boosted supply voltage having a second polarity with respect to the reference supply node.

15. The level shifting circuit of claim 10, wherein:
the driver section comprises
at least a first driver JFET of a first conductivity type having a source-drain path coupled between the reference supply node and the output node and a gate coupled to the first driver control node, and
at least a second driver JFET of a second conductivity type having a source-drain path coupled between the output node and the boosted supply node, and a gate coupled to the second driver control node.

16. A level shifting circuit, comprising:
a driver section that includes
a first driver junction field effect transistor (JFET) having a source-drain path coupled between a reference supply node and an output node, and
a second driver JFET having a source-drain path coupled between the output node and a boosted supply node; and
a variable threshold JFET circuit, coupled between the reference supply node and a power supply node, comprising a plurality of variable threshold JFETs, each variable threshold JFET having two control gates with at least one control gate being coupled to the output node; wherein
the power supply node is coupled to receive a power supply voltage that has a first polarity with respect to the reference voltage, and the boosted supply node is coupled to receive a boosted supply voltage that has a second polarity with respect to the reference voltage.

17. The level shifting circuit of claim 16, further including:

a first charge pump circuit comprising a first capacitor coupled between the first driver control node and a first charge pump input node;

a second charge pump circuit comprising a second capacitor coupled to a second charge pump input node; and an input circuit coupled between the power supply node and the reference supply node that selectively couples the first and second charge pump input nodes to either the power supply node or the reference supply node according to an input signal.

18. The level shifting circuit of claim 17, wherein:

the input circuit comprises at least a first input JFET of a first conductivity type having a source-drain path coupled between the power supply node and the first charge pump input node and a gate coupled to an input node, at least a second input JFET of a second conductivity type having a source-drain path coupled between the reference supply node and the first charge pump input node and a gate coupled to the input node, at least a third input JFET of the first conductivity type having a source-drain path coupled between the power supply node and the second charge pump input node and a gate coupled to the input node, and at least a fourth input JFET of the second conductivity type having a source-drain path coupled between the reference supply node and the second charge pump input node and a gate coupled to the input node.

\* \* \* \* \*